United States Patent [19]

Gamand

[11] Patent Number: 4,754,234
[45] Date of Patent: Jun. 28, 1988

[54] BROADBAND DISTRIBUTED AMPLIFIER FOR MICROWAVE FREQUENCIES

[75] Inventor: Patrice Gamand, Chennevieres, France

[73] Assignee: U.S. Philips Corporation, New York, N.Y.

[21] Appl. No.: 18,563

[22] Filed: Feb. 25, 1987

[30] Foreign Application Priority Data

Feb. 28, 1986 [FR] France ................ 86 02823

[51] Int. Cl.$^4$ .................................. H03F 3/60
[52] U.S. Cl. ................................ 330/286; 330/54
[58] Field of Search .............. 330/53, 54, 57, 277, 330/286

[56] References Cited

U.S. PATENT DOCUMENTS 4,486,719 12/1984 Ayasli .................... 330/54 X
4,543,535 9/1985 Ayasli .................... 330/53
4,564,817 1/1986 Gilson et al. ............ 330/54 X Primary Examiner—Eugene R. LaRoche
Assistant Examiner—Steven J. Mottola
Attorney, Agent, or Firm—Robert J. Kraus

[57] ABSTRACT

A broadband distributed amplifier comprised of a plurality of field effect transistors whose gates are connected to junctions between serially-connected inductors forming a gate transmission line, whose drains are connected to junctions between serially-connected inductors forming a drain transmission line, and whose sources are connected to ground. The distribution of the amplifier stages along the gate and drain transmission lines is effected such that these transmission lines are periodically loaded by their own impedances and by the transistor gate and drain capacitances, thus forming artificial lines, and such that a microwave frequency input signal applied to the input of the gate transmission line effects the production of an amplified microwave frequency output signal at the output of the drain transmission line. The gate and drain transmission line output and input, respectively, are terminated by loads. The drain transmission line input only includes biasing means, whereas the gate transmission line output includes means for compensating for the characteristic impedance variations of the artificial line as a function of the frequency.

10 Claims, 1 Drawing Sheet

BROADBAND DISTRIBUTED AMPLIFIER FOR MICROWAVE FREQUENCES

BACKGROUND OF THE INVENTION

The invention relates to a broadband distributed amplifier comprised of a plurality of field effect transistors whose gates are connected to inductors in such a manner as to form a gate transmission line, whose drains are connected to inductors in such a manner as to form a drain transmission line, and whose sources are connected to ground. The distribution of the amplifier stages along the gate and drain transmission lines is effected such that these lines are periodically loaded by their own impedances and by the transistor gate and drain capacitances thus forming artificial lines, and such that a micro-wave frequency input signal applied to the input of the gate transmission line effects production of an amplified microwave frequency output signal at the output of the drain transmission line. The gate and drain transmission line output and input, respectively, are terminated by loads, and at least one of these loads includes a biasing circuit.

The invention is used for the production of integrated amplifiers on semiconductor substrates of group III-V, which operate in the microwave-frequency range, over a broad band, for example between 2 and 30 GHz and higher.

Such a distributed amplifier is disclosed in the publication IEEE Transactions on Microwave Theory and Techniques, Vol. MTT-32, No. 1, January 1984, in the article "2–20 GHz GaAs Traveling-Wave Amplifier" by YALCIN AYASLI et al., pages 71 to 78.

The above-mentioned document describes that this amplifier is formed by a plurality of cascaded stages. Each stage includes a field-effect transistor whose input and output capacitances are combined with inductors for forming an input line and an output line, respectively. These inductors are of the micro-strip type and consequently are periodically charged by gate and drain impedances of the field-effect transistors.

Such a circuit has the property of having a very broad band, extending to the microwave-frequency range, and of being integrable only on, for example, gallium-arsenide. But as described in the AYASLI publication the amplifier has certain disadvantages. More specifically, its maximum operating frequency is limited because of the biasing circuits which degrade performance. According to the publication, this problem is solved to the best possible extent by sophisticated gate and drain biasing circuits provided at the ends of the artificial transmission lines and constituting line sections and capacitances forming LC circuits.

However, when a person skilled in the art wants to implement the circuit described in the publication, it appears that, in spite of the improvement in the biasing circuits, multiple reflections are produced at the ends of the gate and drain lines which still limit the passband of this amplifier. Because of the coupling between the gate line and the drain line due to gate-drain capacitances of the transistors, the reflections disturb the propagation along the gate and drain lines. It further appears that the variations in the characteristic impedances of the artificial transmission lines versus frequency cannot be accurately compensated for by effecting a simple improvement in the circuits, the biasing circuits included.

SUMMARY OF THE INVENTION

The present invention has for its object to provide a distributed amplifier circuit which does not have these disadvantages.

According to the invention, this object is accomplished by means of a distributed amplifier circuit as defined in the opening paragraph, characterized in that the input end of the drain line includes only biasing means, whereas the output end of the gate line includes means for compensating for the characteristic impedance variations of the artificial lines as a function of the frequency. The distributed amplifier circuit then has inter alia the following advantages:

the characteristic impedance variations versus frequency, of the artificial transmission line (constituted by inductances associated with the gate and drain capacitances of the transistors) are compensated for this is a predominant factor in the improvement provided in the characteristics of the distributed amplifiers as regards passband and gain ripple;

the multiple reflections produced by these variations are reduced;

biassing the gate and the drain of the transistor is realized to the best possible extent;

coupling effects between the gate and drain lines caused by gate-drain capacitances of the transistors are reduced;

the gain ripple caused by disturbances in the propagation of the waves along the transmission lines is considerably reduced;

the passband which, in the prior art, was much less than the cut-off frequency of the artificial lines is increased;

the transistors are used in the best possible conditions and at the maximum of their capabilities.

It should be noted that the distributed amplifier implemented in accordance with the invention renders it possible to obtain frequencies as high as 30 GHz, and more, which is a substantially higher frequency than is obtained with the aid of the considered prior art circuit, whose cut-off frequency is on the order of 20 GHz.

BRIEF DESCRIPTION OF THE DRAWING

The invention and how it can be put into effect will become more apparent from the following description given by way of illustration with reference to the accompanying drawing figures in which.

DESCRIPTION OF THE PREFERRED EMBODIMENT

Figure 1:
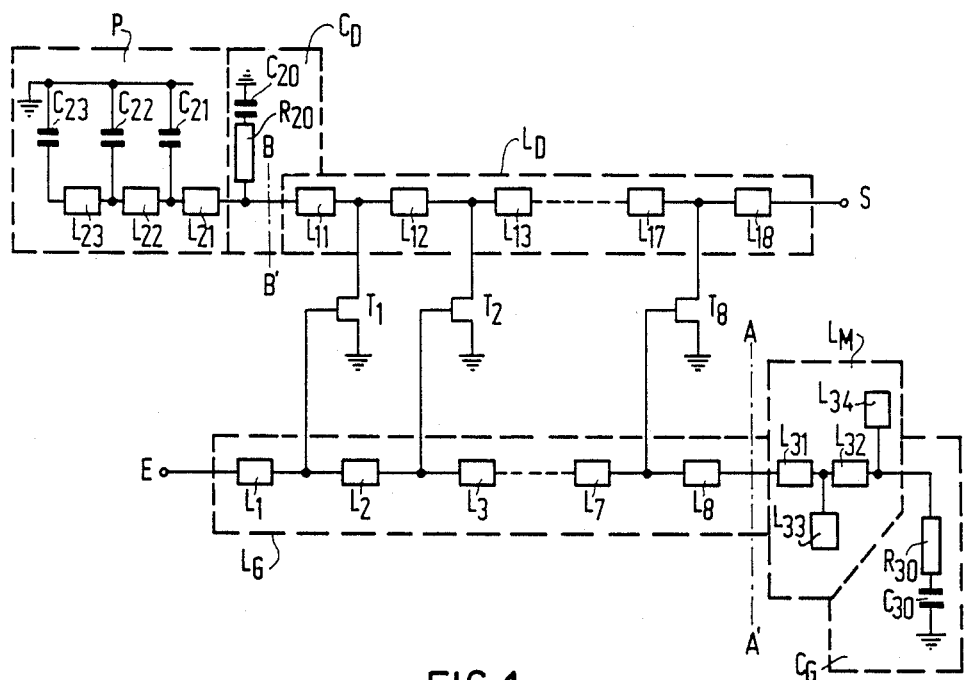
FIG. 1 shows an amplifier circuit according to the invention.

As is shown in FIG. 1, the distributed amplifier comprises, according to the invention, a number of field-effect transistors $T_1$, $T_2$, . . . etc. in a common source configuration, a first line $L_G$ formed from microwave frequency line sections $L_1$, $L_2$, . . . etc. and a second line $L_D$ formed from microwave frequency line sections $L_{11}$, $L_{12}$, . . . etc.

The gates of the transistors $T_1$, $T_2$, . . . are periodically connected to the gate line $L_G$ at junctions between the microwave-frequency line sections $L_1$, $L_2$, . . . respectively.

The drains of the transistors $T_1$, $T_2$, . . . are periodically connected to the drain line $L_D$ at junctions between the microwave frequency line sections $L_{11}$, $L_{12}$, ... respectively.

A microwave frequency input signal E is applied to the amplifier at the input end of the gate line $L_G$, and the amplified microwave-frequency output signal S is produced at the output end of the drain line.

The natural impedances $L_1$, $L_2$, ... of the gate line $L_G$ form together with the intrinsic gate-source capacitances of the field effect transistors $T_1$, $T_2$, ... a distributed microwave frequency line, an artificial line.

The same holds for the drain line $L_D$, between the natural impedances $L_{11}$, $L_{12}$, ... and the drain-source capacitances of the field-effect transistors $T_1$, $T_2$, ....

The operating principle of the distributed amplifier is based on the propagation of signals along artificial transmission lines thus formed. When the microwave frequency signal E is applied to the gate line, it is propagated by exciting each transistor which then produces an output power capable of propagating itself to the drain line. If the phase rate of the two artificial lines is identical, the output power phases are added together during the propagation along the drain line. It is then possible to obtain an amplification in a frequency band which is inter alia limited by the cut-off frequency of the transmission lines.

When the amplifier operates at different frequencies in the microwave frequency range, it will be obvious that the line sections $L_1$, $L_2$, $L_{11}$, $L_{12}$, ... can represent small transmission line sections for frequencies of, for example, 12 GHz, while the same sections may have a length on the order of the value of a wave length for frequencies of, for example, 20 GHz. The length of the section is calculated in such a manner as to provide the phase shift necessary for a proper operation of the amplifier.

The amplifier includes inter alia at least one sophisticated biasing circuit P at the input end of the line $L_D$. This biasing circuit P is formed by microwave frequency transmission line sections $L_{21}$, $L_{22}$, $L_{23}$, and capacitors $C_{21}$, $C_{22}$, $C_{23}$ which are arranged between ground and junction points between each of the line sections $L_{21}$, $L_{22}$, $L_{23}$, ....

The lines $L_G$ and $L_D$ are inter alia terminated by respective loads $C_G$ and $C_D$.

The load connected to the gate line $L_G$ is in the form of a resistor $R_{30}$ and a capacitor $C_{30}$ which are arranged in series and placed between the output of the line $L_G$ and ground.

However, such an arrangement can be still further improved, using the measures in accordance with the invention.

Actually, the operating frequency of such a distributed amplifier is theoretically limited by the cut-off frequency of the field-effect transistors and also by the cut-off frequency of the artificial lines.

The real cut-off frequency of the circuit is actually much less than the theoretical frequencies, for this cut-off frequency is limited by the multiple reflections and resonant phenomena resulting therefrom. It has already been demonstrated that these phenomena are due to characteristic impedance variations in the lines when the operating frequency fluctuates, and that improving only the biasing is not sufficient to suppress these phenomena. These reflection phenomena appear more specifically on the gate line, in the region of the plane AA', and comprises reflections of the wave on the gate line propagating from the input E toward the load $C_G$.

On the drain line, a portion of the wave flows to the output S and a further portion of the wave flows to the plane BB'. But this last incident wave which arrives at BB' is highly attenuated, so that the reflections are very weak and do not require an additional compensation circuit.

According to the invention, the variation of the line impedance is compensated for by a circuit $L_M$ connected between the output of the gate line $L_G$ and the load $C_G$, in the region of the plane AA'.

This impedance-compensating circuit $L_M$ is constituted by two microwave frequency line sections $L_{31}$ and $L_{32}$ arranged in series in the extension of the line $L_G$, and at least one open line $L_{33}$ which is, for example, connected to a junction between the sections $L_{31}$ and $L_{32}$.

In a preferred manner, a second open line $L_{34}$ is also added to this circuit $L_M$ and is connected to a junction between the section $L_{32}$ and the load $C_G$.

The circuit $L_M$ has at its input (in the plane AA') an impedance whose frequency behavior is identical to the frequency behavior of the characteristic impedances of the gate and drain lines.

Thus, the impedance variations with frequency are compensated for, the resonance phenomena due to multiple reflections are suppressed, the effect of the coupling between the lines is reduced and the described advantages are obtained.

Improving the biasing also becomes more effective, because the transistors operate in better conditions.

The total of these improvements make it possible to obtain a wider passband whose cut-off frequency approaches the theoretical cut-off frequency, with a ripple on the reduced gain.

It should be noted that in a distributed amplifier of the type according to the invention, the line section connected to the drain of the transistor $T_1$ in the position $L_{11}$ does not form part of the load $C_D$ but forms part of the drain line $L_D$. Similarly, the line section connected to the gate of the transistor $T_8$ in the position $L_8$ does not form part of the load $C_G$, but forms part of the gate line $L_G$. This is caused by the operating principle of a distributed amplifier.

Consequently, it should be noted that although in the AYASLI publication it is written that more sophisticated loads are provided while taking these end sections of the artificial lines into account, such an assertion cannot be supported, as it is not consistent with the theoretical operating principle of such an amplifier.

In a practical example, the distributed amplifier according to the invention is constituted by 8 field-effect transistors. The transmission line sections are of the microstrip line type.

The values of the gate lengths L of the transistors, the gate widths l of the transistors, their cut-off voltage $V_T$, the width W of the transmission lines, and the length $\phi$ of the transmission lines are listed in the following Table I.

In the preferred embodiment, the impedance-compensating circuit is disposed on a substrate having a thickness e=250 $\mu$m and a dielectric constant $\epsilon$=9.6 and is, for example, made of ceramic material, and more particularly of aluminium oxide. The transistors are of the implant type provided, for example, on a semi-insulating substrate of the group III-V, such as gallium arsenide. The electrodes of the transistors can be connected to the lines by ultra-short wires in such a manner that the transistor and line assembly is supported by a common insulating substrate, which is completely independent and without external biasing.

In a further practical embodiment, the total of transistors and inductances forming the lines may be monolithically integrated on a substrate made of a composite material from the group III-V, such as gallium arsenide.

TABLE I

| AsGa Transistors 6 $T_1 \ldots T_8$ | 75 μm | L 0.5 μm | $V_T$ 3V | Type N-type |
|---|---|---|---|---|
| Transmission lines | W | | | |
| $L_{12}, L_{13} \ldots L_{17}$ | 50 μm | | 545 μm | |
| $L_2, \ldots L_7$ | 50 μm | | 300 μm | |
| $L_{11}$ and $L_{18}$ | 50 μm | | 545/2 μm | |
| $L_1$ and $L_8$ | 50 μm | | 150 μm | |
| $L_{31}$ | 50 μm | | 146 μm | |
| $L_{32}$ | | | 110 μm | |
| $L_{33}$ | | | 600 μm | |
| $L_{34}$ | | | 900 μm | |
| Drain biasing | W | ζ | Capacitor | |
| $L_{21}$ | 30 μm | 2150 μm | | |
| $L_{22}$ | 30 μm | 1310 μm | | |
| $L_{23}$ | 30 μm | 370 μm | | |
| $C_{21}, C_{22}, C_{23}$ | | | 47 pF | |
| Loads | Resistors | Capacitors | | |
| $R_{20}$ | 40 Ω | | | |
| $C_{20}$ | | 47 pF | | |
| $R_{30}$ | 53.4 Ω | | | |
| $C_{30}$ | | 47 pF | | |

Figure 2:
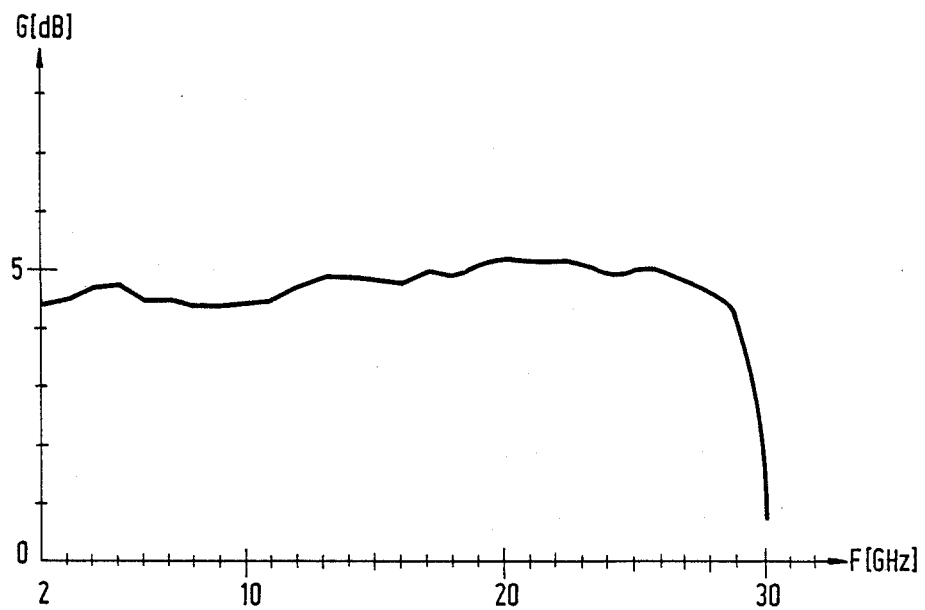
FIG. 2 shows the gain in dB as a function of frequency for the amplifier circuit of FIG. 1.

With the preferred configuration described in the foregoing, the gain versus frequency curve shown in FIG. 2 is obtained. This curve shows that a gain of at least 4.5 dB is obtained between 2 and 30 GHz, as mentioned in the foregoing. This curve has been plotted in those conditions in which the drain-source voltage of the transistors is $V_{DS}=4$ V for a drain current $I_D=150$ mA.

What is claimed is:

1. In a broadband distributed amplifier of the type comprising:
   a. a first transmission line including an input end for receiving an applied microwave-frequency input signal, an output end, a plurality of inductors electrically connected in series between said ends, and a plurality of junctions disposed periodically along said line;
   b. a second transmission line including an input end, an output end for providing an amplified microwave-frequency output signal, a plurality of inductors electrically connected in series between said ends, and a plurality of junctions disposed periodically along said line; and
   c. a plurality of field effect transistors, each including a gate electrically connected to a respective one of the junctions in the first transmission line, a drain electrically connected to a respective one of the junctions in the second transmission line, and a source electrically connected to a reference potential;
   the improvement comprising means for maximizing the useable frequency range of the amplifier, said means including:
   d. an impedance-compensating circuit electrically connected to the output end of the first transmission line, said circuit having a frequency-dependent input impedance which varies correspondingly with a frequency-dependent characteristic impedance of the transmission lines and suppresses signal reflections at said output end; and
   e. a biasing circuit electrically connected to the input end of the second transmission line.

2. An amplifier as in claim 1 where the impedance-compensating circuit comprises a plurality of transmission line sections electrically connected in series and an open-circuited transmission line section electrically connected to a junction disposed between successive ones of said sections.

3. An amplifier as in claim 2 where the impedance-compensating circuit comprises two of the serially-connected transmission line sections and at least one of the open-circuited transmission line sections.

4. An amplifier as in claim 1, 2 or 3 where the biasing circuit comprises a plurality of transmission line sections electrically connected in series and a plurality of capacitors each having one end electrically connected to a respective junction disposed between successive ones of said sections and having an opposite end electrically connected to a reference potential.

5. An amplifier as in claim 1, 2 or 3 where the output end of the first transmission line and the input end of the second transmission line are each terminated in a load comprising a resistor electrically connected in series with a capacitor.

6. An amplifier as in claim 1, 2 or 3 where the entire amplifier is disposed on an insulating substrate.

7. An amplifier as in claim 5 where the substrate consists essentially of a ceramic material.

8. An amplifier as in claim 7 where the substrate consists essentially of aluminum oxide.

9. An amplifier as in claim 1, 2 of 3 where the entire amplifier is monolithically integrated on a substrate consisting essentially of a III-V compound.

10. An amplifier as in claim 9 where the compound is gallium arsenide.

* * * * *